United States Patent [19]

Komatsu et al.

[11] 4,236,832
[45] Dec. 2, 1980

[54] STRAIN INSENSITIVE INTEGRATED CIRCUIT RESISTOR PAIR

[75] Inventors: Shigeru Komatsu, Yokohama; Satoshi Takahashi, Tokyo; Kouji Suzuki; Masao Wakatsuki, both of Yokohama, all of Japan

[73] Assignee: Tokyo Shibaura Denki Kabushiki Kaisha, Japan

[21] Appl. No.: 920,358

[22] Filed: Jun. 29, 1978

[30] Foreign Application Priority Data

Jun. 29, 1977 [JP] Japan .................................. 52-76465
Jul. 14, 1977 [JP] Japan .................................. 52-83591
Jul. 14, 1977 [JP] Japan .................................. 52-83593
Jul. 14, 1977 [JP] Japan .................................. 52-83595

[51] Int. Cl.³ .......................................... H01L 27/04
[52] U.S. Cl. ...................................... 357/51; 357/26; 357/60; 357/72
[58] Field of Search ............................. 357/26, 51, 60

[56] References Cited

U.S. PATENT DOCUMENTS

| 3,186,217 | 6/1965 | Pfann | 357/26 |
| 3,266,303 | 8/1966 | Pfann | 357/26 |
| 3,705,993 | 12/1972 | Grigorovici et al. | 357/26 |
| 3,819,431 | 6/1974 | Kurtz et al. | 357/26 |
| 4,025,941 | 5/1977 | Kanda et al. | 357/26 |

Primary Examiner—William D. Larkins
Attorney, Agent, or Firm—Finnegan, Henderson, Farabow, Garrett & Dunner

[57] ABSTRACT

A semiconductor device includes first and second resistor regions having the same resistance and formed in a main surface of a silicon substrate to extend in a perpendicular direction. When the resistor regions have a p-conductivity type, said main surface is a {100} face, {511} face, {811} face or {911} face. When the resistor regions are of an n-conductivity type, said main surface is a {111} face.

10 Claims, 10 Drawing Figures

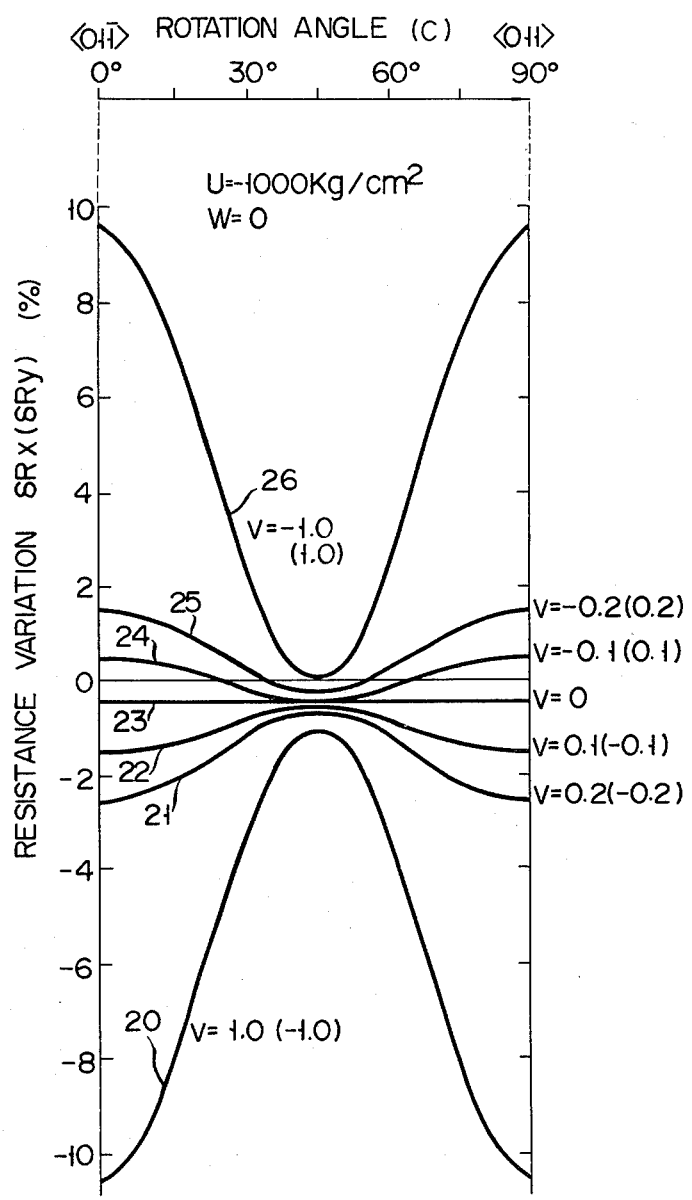

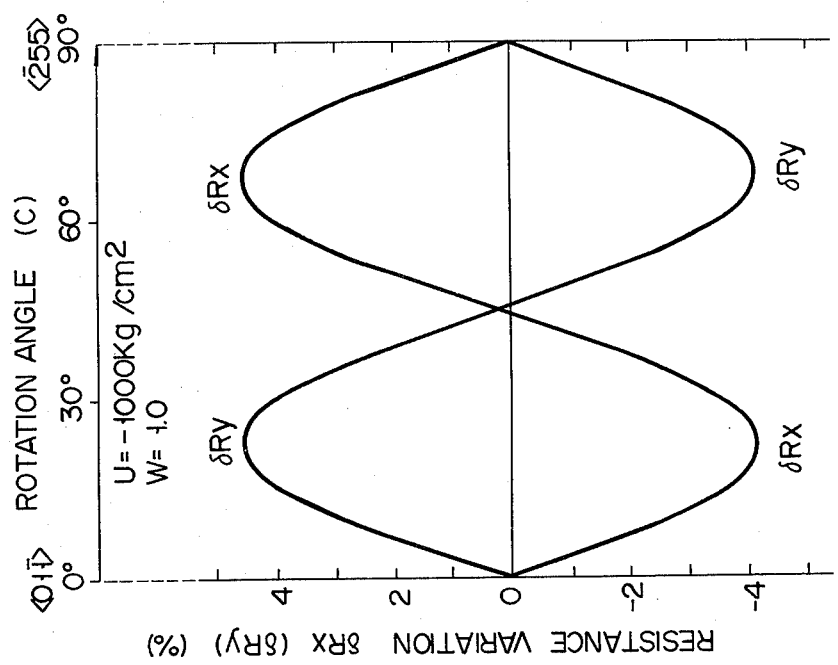
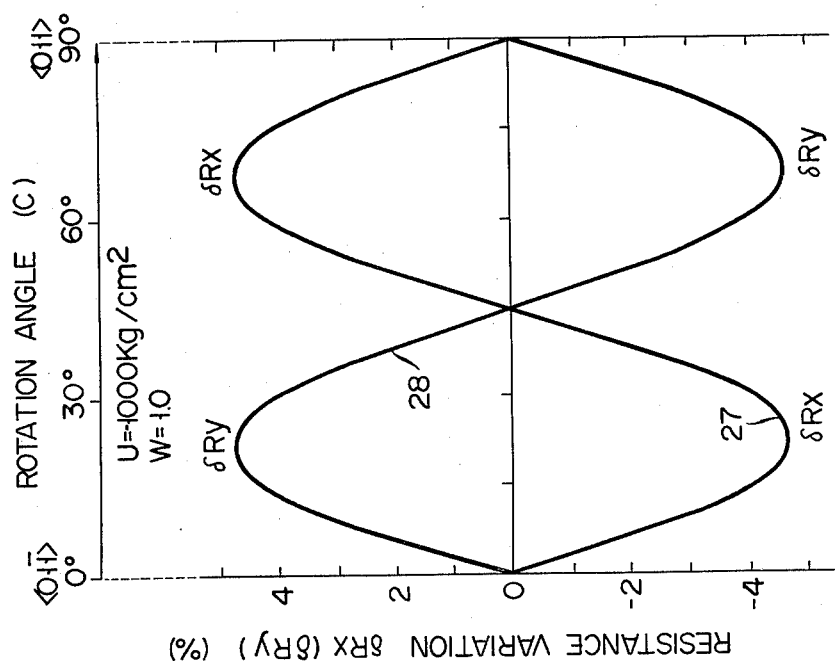

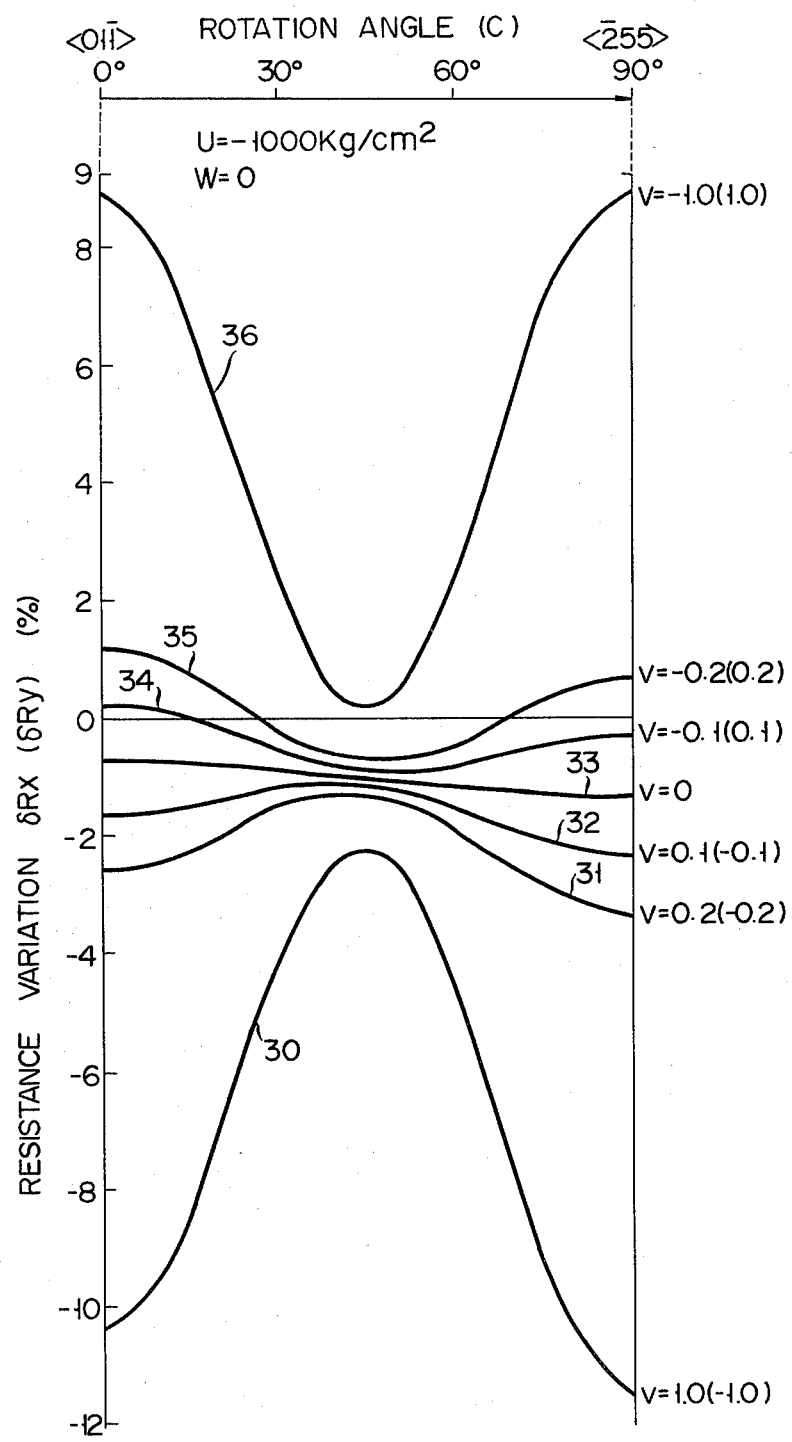

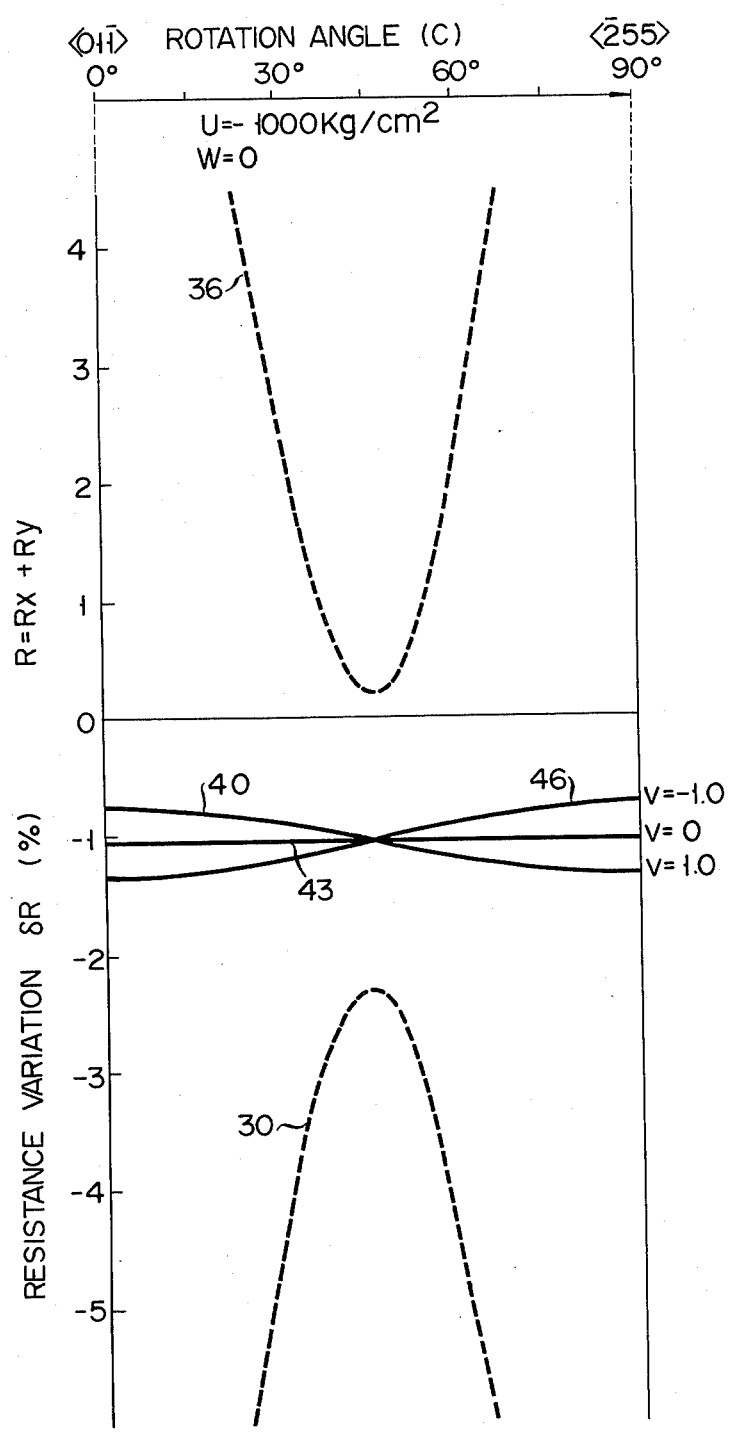

STRAIN INSENSITIVE INTEGRATED CIRCUIT RESISTOR PAIR

This invention relates to a semiconductor device, and more particularly to a silicon semiconductor device whose main plane is provided with a resistor element.

A semiconductor device such as a semiconductor integrated circuit generally comprises a silicon substrate hundreds of microns thick, a resistor element consisting of a region formed in the surface of the silicon substrate with a depth ranging between several microns and scores of microns, and other functional elements. A large number of such semiconductor devices are produced simultaneously by applying photoetching and selective impurity diffusion to a semiconductor wafer, later testing individual semiconductor elements formed in the wafer for their electric properties, cutting out the semiconductor elements out of the wafer, and finally sealing the respective semiconductor elements in an envelope. Generally, the semiconductor element is hermetically sealed in plastic resin molding used as an envelope. A plastic resin molding is selected from the standpoint of cost reduction and quantity of production. The aforementioned test is made before sealing in the plastic resin molding because if disqualified semiconductor devices are detected before sealing in said plastic resin molding, then it is possible to save the work of the succeeding steps and minimize the waste of said resin. The test becomes effective only on the assumption that the electric properties possessed by the semiconductor element before sealing in the plastic resin molding do not change from those occurring after said sealing.

Actually, however, where the semiconductor element is sealed in the plastic resin molding, the electric properties possessed by said element before sealing noticeably change due to strains arising from the shrinkage of said molding at the time of sealing and the different thermal expansion coefficients between the resin molding and semiconductor substrate. These strains also give rise to viriations in the properties of the respective elements of the semiconductor device which are formed in the semiconductor substrate. Where such variations become prominent, the electric properties of the semiconductor device fall far short of the prescribed range, thus undesirably leading to manufacture of disqualified semiconductor devices, and in consequence a decline in the yield. These events prevent the test conducted before sealing the semiconductor element in the resin molding from displaying the expected effect.

Hitherto, various processes have been proposed to minimize the strains occurring when the semiconductor element is sealed in the plastic resin molding. One of the proposed processes is to provide, between the resin molding and semiconductor substrate, an encapsulating material which effectively suppresses the shrinkage of the resin molding. However, this process has the drawbacks that the encapsulating material has to be mounted on the surface of a semiconductor element, and since the encapsulating material and resin molding have widely different thermal expansion coefficients, bonding wires are often broken at the interface between them due to the repeated cycles of heating and cooling and thermal shocks arising therfrom, thus making it impossible to elevate the yield of a semiconductor device.

It is accordingly the object of this invention to provide a semiconductor device which can be easily manufactured with a good yield, dispensing with complicated operation steps.

According to one aspect of this invention, there is provided a semiconductor device, which comprises a silicon substrate having one main plane, a first resistor unit formed in the main region of the main plane of the silicon substrate to extend in one direction, and a second resistor unit formed in said main region to extend in a direction perpendicular to said one direction, both resistor units electrically connected together and the resistances of said resistor units occurring in both directions having the ratio of 1:1, wherein when the resistor units have a p-conductivity type, a substantial crystal face of said main plane is a {100} face, {511} face, {811} face or {911} face, and when the resistor units are of an n-conductivity type, a substantial crystal face of said main plane is a {111} face.

As used herein, the term "substantial crystal face" is not defined to mean only a specified crystal face shown by { }, but includes the error range of ±5° generally known in this particular field. Consequently, a substantial {100} face, for example, includes any crystal face lying within the range of ±5° displaced from the regular {100} crystal face.

The "resistor unit" means an element for acting as a resistor. The resistance occurring in the direction in which the resistor unit extends represents that which arises across both ends of that passage of the resistor unit through which operating current is conducted. The first and second resistor units may be electrically connected directly to each other, or by means of an intervening electrode or by an external wire. Each of said first and second resistor units does not restrictively mean a single continuous layer, but a unit formed of a plurality of independent resistor regions. In the latter case, the resistance of the resistor unit denotes the total resistance of all the independent resistor regions. The "main region of the main plane" of the silicon semiconductor substrate means the whole or specified portion of said main plane.

This invention can be more fully understood from the following detailed description when taken in conjunction with the accompanying drawings, in which.

Figure 10:
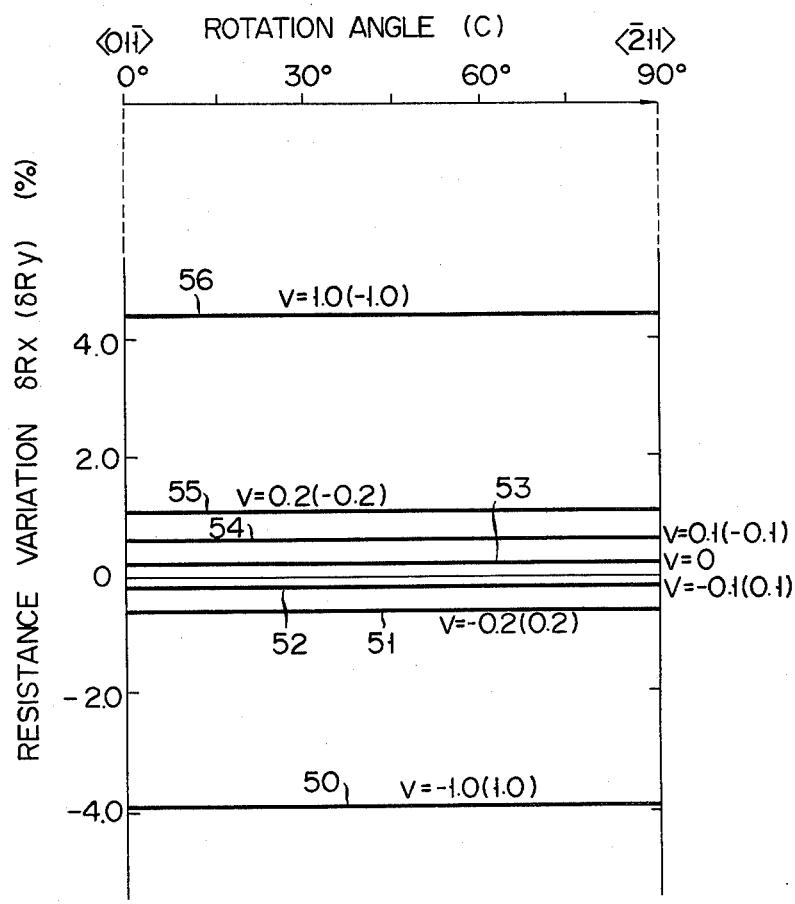

FIG. 5 graphically shows those variations in the resistances of resistor units formed in the main crystal face (100) of the silicon substrate which occur in the directions in which the resistor units extend in the main crystal face (100) when compression stress is applied to a semiconductor element;

FIG. 6 graphically sets forth those variations in the resistances of resistor units formed in the main crystal face (100) of the silicon substrate which occur in the directions in which the resistor units extend in the main crystal face (100), when shearing stress is applied to a semiconductor element, FIG. 7 graphically indicates those variations in the resistances of resistor units formed in the main crystal plane (511) of the silicon substrate which arise in the directions in which the resistor units extend over the main crystal face (511), when compression stress is imparted to a semiconductor element;

FIG. 8 graphically shows those variations in the total resistance of resistor units formed in the main crystal face (511) of the silicon substrate which take place in the directions in which the resistor units extend in the main crystal face (511), when compression stress is applied to a semiconductor element;

FIG. 9 graphically illustrates those variations in the resistances of resistor units formed in the main crystal face (511) which appear in the directions in which the resistor units extend in the main crystal face (511), when shearing stress is applied to a semiconductor element; and FIG. 10 sets forth those variations in the resistances of resistor units formed in the main crystal face (111) of the silicon substrate which occur in the direction in which the resistor units extend in the main crystal face (111) when a semiconductor element is subjected to mechanical or thermal stresses.

There will now be described by reference to the accompanying drawings a semiconductor device embodying this invention.

Figure 1:
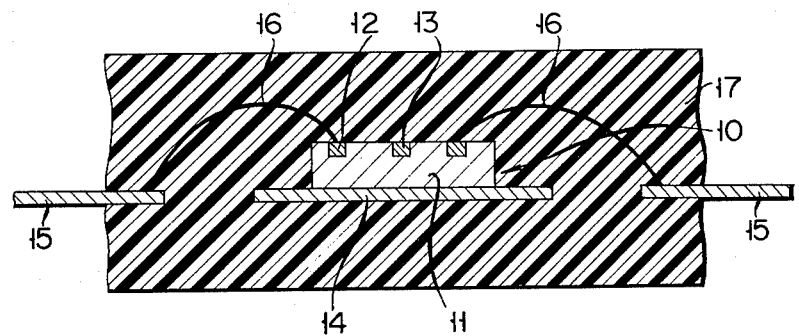
FIG. 1 is a sectional view of a semiconductor device embodying this invention.

Referring to FIG. 1, referential numeral 10 denotes a semiconductor element which comprises a resistor layer 12 and another functional element 13 formed by the known selective diffusion technique in the upper main surface of an n-conductivity type silicon substrate 11 in which phosphorus is doped at a concentration of $10^{15}$ atoms/cm$^3$. The main surface of the silicon substrate 11 has a crystal face {100}. The resistor layer 12 is formed in said crystal face {100} by selectively diffusing boron at a surface concentration of $10^{18}$ atoms/cm$^2$ and with a depth of 2.7 microns. The main surface of the silicon substrate 11 may have a crystal face {511},{811} or {911} in place of the crystal face {100}. Further where the resistor layer 12 is of the n-conductivity type, the main surface of the silicon substrate 11 may have a crystal face {111}.

The semiconductor element 10 has the bottom plane bonded by conductive epoxy resin to a supporting plate 14 made of metal such as copper alloy or nickel alloy. The resistor layer 12 and functional element 13 are electrically connected together by, for example, aluminium selectively retained on the surface of the silicon semiconductor substrate 11. The resistor layer 12 and functional element 13 are further connected to a lead frame 15 through a metal wire referred to as a bonding pad and bonding wire 16. The semiconductor element 10, supporting plate 14, bonding wire 16 and part of the lead frame 15 are sealed in a plastic resin molding 17.

Figure 2:
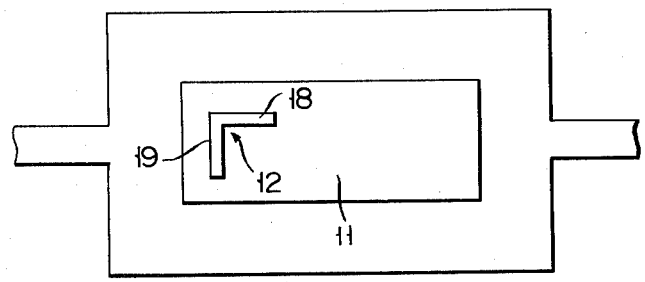
FIG. 2 is a plan view of a semiconductor element constituting the semiconductor device of FIG. 1 with the plastic resin molding removed.
Figure 3:
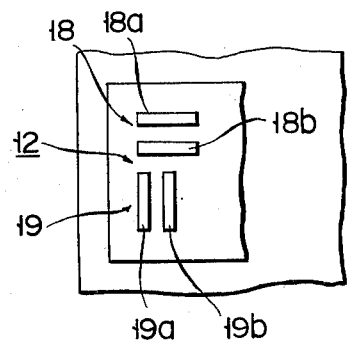
FIGS. 3 and 4 are fractional plan views of the modifications of the semiconductor element of FIG. 2.
Figure 4:
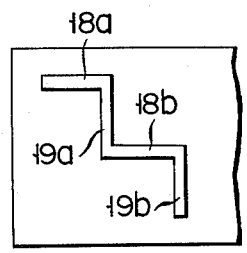

The resistor layer 12 comprises, as shown in FIG. 2, a first resistor unit 18 extending along one crystal axis and a second resistor unit 19 extending along a line perpendicular to said crystal axis. The size of the first and second resistor units 18, 19 and/or the point thereon to which the bonding wire 16 is fitted are so defined as to enable the first and second resistor units 18, 19 to have the same level of resistance. The resistor layer 12 may be formed of, for example, four resistor units as shown in FIG. 3. In this case, the first resistor unit 18 consists of two resistor regions 18a, 18b extending parallel along one crystal axis. The second resistor unit 19 is formed of two resistor regions 19a, 19b extending parallel along a line perpendicular to said crystal axis. These groups of resistor regions 18a, 18b and 19a, 19b are electrically connected. In this case, the first resistor unit 18 and second resistor unit 19 are so designed that the total resistance of the resistor regions 18a, 18b is equal to that of the resistor regions 19a, 19b. The resistor regions 18a, 18b of the first resistor unit 18 and the resistor regions 19a, 19b of the second resistor unit 19 may obviously be connected together in advance within the semiconductor element 10, as illustrated in FIG. 4.

With respect to the semiconductor element of FIG. 2, there were provided 5 samples of a first group in which the first resistor unit 18 extended along the orientation <001> and the second resistor unit 19 extended along the orientation <010>, 5 samples of a second group in which the first resistor unit 18 extended along the orientation <011> and the second resistor unit 19 extended along the orientation <01$\bar{1}$>, 5 samples of a third group in which the first resistor unit 18 extended along the orientation <011> and the second resistor unit 19 extended along an orientation displaced 60° from the orientation <011> toward the orientation <01$\bar{1}$>, 5 samples of a fourth group in which the first resistor unit 18 extended along the orientation <011> and the second resistor unit 19 extended along the orientation <01$\bar{1}$>, and 5 samples of a fifth group in which the first resistor unit 18 extended along an orientation displaced 30° from the orientation <011> toward the orientation <01$\bar{1}$>, and the second resistor unit 19 extended along an orientation displaced 60° from the orientation <011> toward the orientation <01$\bar{1}$>. In the fourth group, the resistances of the first resistor unit 18 and second resistor unit 19 had the ratio of 3/2:1. In the other groups, the resistances of both resistor units 18, 19 had the ratio of 1:1. Measurement was made of the total resistance Ro of the first and second resistor units 18, 19 of a semiconductor element corresponding to each sample of the above-mentioned five groups as they were just formed in a wafer, that is, before being mounted on the supporting plate 14; the total resistance Rm of the first and second resistor units 18, 19 of said semiconductor element mounted on the supporting plate 14 but not yet sealed in the plastic resin molding 17; and the total resistance Rs of the first and second resistor units 18, 19 of said semiconductor element after sealing in the plastic resin molding 17, the results being set forth in Table 1 below.

TABLE 1

|  | Wafer state | After mounting | After molding |
|---|---|---|---|
| 1st group | 0(1302) | −0.1(1301) | +0.1(1303) |
|  | 0(1317) | −0.2(1315) | −0.1(1316) |
|  | 0(1322) | −0.1(1321) | −0.2(1320) |
|  | 0(1308) | −0.1(1307) | 0(1308) |
|  | 0(1312) | −0.2(1300) | −0.2(1310) |
| 2nd group | 0(1082) | −0.1(1081) | −0.2(1080) |
|  | 0(1072) | 0(1072) | 0(1072) |
|  | 0(1076) | −0.1(1075) | 0(1076) |
|  | 0(1071) | −0.2(1069) | −0.2(1069) |
|  | 0(1085) | −0.1(1084) | −0.2(1083) |
| 3rd group | 0(1265) | −0.1(1264) | −0.8(1255) |
|  | 0(1272) | −0.2(1270) | −0.9(1260) |
|  | 0(1268) | (1268) | −0.9(1257) |
|  | 0(1270) | −0.2(1268) | −0.8(1260) |
|  | 0(1275) | −0.2(1273) | −1.1(1261) |
| 4th group | 0(1424) | −0.1(1423) | −1.1(1261) |
|  | 0(1420) | −0.1(1418) | 31 1.1(1405) |
|  | 0(1430) | −0.1(1428) | −1.0(1415) |
|  | 0(1428) | −0.1(1426) | −1.1(1413) |
|  | 0(1423) | 0(1423) | −0.9(1410) |
| 5th group | 0(1218) | −0.2(1216) | −0.1(1217) |
|  | 0(1223) | −0.1(1222) | 0(1223) |
|  | 0(1221) | −0.1(1220) | −0.2(1219) |
|  | 0(1216) | −0.1(1215) | −0.1(1215) |
|  | 0(1218) | −0.2(1216) | −0.1(1217) |

In Table 1, numerals enclosed in the parentheses denote the total resistance (Ω) of the resistor units 18, 19, and numerals given outside of the parentheses represent variations (%) in said total resistance. The total resistance of a semiconductor element corresponding to each sample of the five groups is represented by the character R preceding a crystal orientation along which the first and second resistor units 18, 19 extend (for example, R<001>, R<010> in the case of the 1st group).

Table 1 above shows that with the semiconductor elements of the 1st, 2nd and 5th groups in which the first and second resistor units 18, 19 were arranged perpendicular to each other according to this invention, little difference was observed between the total resistance Ro of the first and second resistor units 18, 19 of a semiconductor element just formed in a wafer and the total resistance Rs of the resistor units 18, 19 of the semiconductor element sealed in the plastic resin molding 17; whereas, with the semiconductor elements of the 3rd and 4th groups which fall outside of the scope of the claims of this invention, the total resistance Rs of the resistor units 18, 19 of the semiconductor element sealed in the plastic resin molding 17 widely changed from the initial resistance Ro when the semiconductor element was just formed in a wafer.

Further, 4 samples of the 2nd and 4th groups respectively were prepared. Measurement was made of changes in the resistances of the first and second resistor units 18, 19 respectively, as well as their total resistances Ro, Rm, Rs in the same manner as in the case of Table 1, the results being presented in Table 2.

TABLE 2

|           | Wafer state       | After mounting | After molding |
|-----------|-------------------|----------------|---------------|
| 2nd group | R<011><br>R<01>R<br><011> | R<011><br>R<011> | R<011>      |
|           | Ro                | Rm             | Rs            |
|           | 0(540)            | 0(540)         | −3.1(523)     |
|           | 0(534)            | 0(534)         | +3.7(554)     |
|           | 0(1074)           | 0(1074         | +0.3(1077)    |
|           | 0(542)            | −0.6(539)      | −2.6(523)     |
|           | 0(534)            | +0.4(536)      | +2.3(549)     |
|           | 0(1076)           | −0.1(1075)     | +0.1(1077)    |
|           | 0(544)            | +0.5(542)      | −3.9(523)     |
|           | 0(537)            | −0.2(536)      | +4.7(562)     |
|           | 0(1081)           | −0.3(1078)     | +0.4(1035)    |
| 4th group | 30° displaced orientation | | |
|           | Ro                | Rm             | Rs            |
|           | 0(609)            | +0.2(610)      | +2.0(621)     |
|           | (611)             | −0.3(609)      | −2.1(598)     |
|           | 0(1220)           | −0.1(1219)     | −0.2(1218)    |
|           | 0(609             | +0.3(611)      | +2.1(622)     |
|           | 0(690)            | −0.5(606)      | −2.3(595)     |
|           | 0(1218)           | −0.1(1217)     | −0.1(1217)    |
|           | 0(613)            | +0.3(615)      | +1.3(624)     |
|           | 0(610)            | −0.7(606)      | −2.1(507)     |
|           | 0(1223)           | −0.2(1221)     | −0.2(1221)    |

Table 2 shows that the initial resistance Ro of the first and second resistor units 18, 19 respectively of each semiconductor element just formed in a wafer widely changed from the resistance Rs of said resistor units 18, 19 respectively when the semiconductor element was sealed in the plastic resin molding 17, whereas the initial total resistance of both resistor units 18, 19 of the semiconductor element just formed in a wafer was little different from their total resistance Rs when the semiconductor element was sealed in the plastic resin molding 17. A numeral given on the bottom line of the respective columns of Table 2 denotes the total resistance of both resistor units 18, 19.

There will now be discussed from a theoretical point of view the concept on which this invention is based.

With a semiconductor device constructed as shown in FIG. 2, let it be assumed that the direction in which the first resistor unit 18 extends is denoted by x and the perpendicular direction thereto in which the second resistor unit 19 extends is represented by y, and the resistances of the resistor units 18, 19 are indicated by Rx, Ry respectively. Where the first and second resistor units 18, 19 are each formed of a plurality of resistor regions as illustrated in FIGS. 3 and 4, then the resistances of said resistor units 18, 19 are represented by the total resistances of the corresponding plural resistor regions, as indicated by the following formulas:

$$Rx = \sum_{i=1}^{n} Rxi$$

$$Ry = \sum_{i=1}^{n} Ryi$$

Further, let it be assumed that a direction perpendicular to the semiconductor substrate is denoted by z, and the total resistance R of the resistance units 18, 19 is expressed as $$R = Rx + Ry$$

According to the piezoelectric effect derived from determination of changes in the resistance of a solid when a known amount of stress is applied, a change $\delta R$ in the total resistance R caused by an external stress varies with the shape of a semiconductor substrate as expressed by the following formula:

$$\delta R = \frac{\Delta R}{R} = \frac{1}{R}[(RxP_{11} + RyP_{21})S_1 \quad (1)$$
$$+ (RxP_{12} + RyP_{22})S_2$$
$$+ (RxP_{16} + RyP_{26})S_6]$$

where:

$S_1$, $S_2$ = stress components acting in the x and y directions $S_6$ = shearing stress components acting along the x and y planes $Pij$ = index of the crystal face of a semiconductor substrate in which a resistor layer is formed.

This index is a piezoelectric coefficient defined by the direction in which the resistor units respectively having resistances Rx, Ry extend and also by the concentration of an impurity constituting the resistor units.

$P_{11}$, $P_{22}$ = vertical effect coefficients denoting the strength of the stresses $S_1$, $S_2$ acting in the x and y directions which affect the resistances Rx, Ry of the resistor units 18, 19, when current is introduced in the x and y directions.

$P_{12}$, $P_{21}$ = horizontal effect coefficients representing the strength of the stresses $S_2$, $S_1$ which affect the resistances Rx, Ry.

$P_{16}$, $P_{26}$ = coefficients showing the strength of shearing stress $S_6$ acting along the x and y planes.

According to the piezoelectric effect, many shearing stresses other than $S_6$ actually arise, such as shearing stress $S_3$ acting in the z direction, shearing stress $S_4$ occurring in the yz plane, and shearing stress $S_5$ arising in the zx plane. However, these three stresses $S_3$, $S_4$, $S_5$ are relatively unimportant in view of the specific stress characteristics of a semiconductor device sealed in plastic resin molding and, consequently, are put out of discussion. This is because with a semiconductor device including a supporting plane which is constructed in the form of a thin plate as a whole, $S_1$, $S_2$, $S_6$ are stresses arising when a force resulting from the contraction of the plastic resin molding 17 is sustained by a narrow lateral or cross-sectional plane lying between the semiconductor element and supporting plate. In contrast, $S_3$, $S_4$, $S_5$ are stresses occurring when a force resulting from the contraction of the plastic resin molding 17 is sustained by the broad upper and lower surfaces of the semiconductor device. Therefore, the stresses $S_3$, $S_4$, $S_5$ are too small relative to the stresses $S_1$, $S_2$, $S_6$ to become a main factor of resistance variation. Calculation was made of changes in $P_{11}$, $P_{12}$ and in consequence $P_{22}$ and $P_{21}$ and further in $P_{16}$ and $P_{26}$ which were caused by those variations in the resistances of the first and second resistor units 18, 19 which occurred in the mutually perpendicular directions x, y. FIG. 5 sets forth the results of calculation made of $P_{11}(=P_{22})$ and $P_{12}(=P_{21})$. FIG. 6 shows the results of calculation made of $P_{16}$ and $P_{20}$. The abscissa of FIGS. 5 and 6 denotes a rotation angle C of 0° to 90° through which the direction x is displaced from the orientation $<01\bar{1}>$ through the orientation $<010>$ toward the orientation $<011>$, and in consequence the direction y is displaced from the orientation $<011>$ through the orientation $<001>$ toward the orientation $<0\bar{1}1>$. The ordinate of FIG. 5 represents resistance variation $\delta Rx$ or $\delta Ry$ caused by stresses acting along a plane. Assuming $U=-(\frac{1}{2})(S_1+S_2)=-1000$ kg/cm$^2$ (compression stress), $W=S_6/(S_1+S_2)=0$, $S_6=0$, then v defined as $v=(S_1-S_2)/(S_1+S_2)$ is taken to have values of 1.0, 0.2, 0.1, 0.0, $-0.1$, $-0.2$ and $-1.0$. The curves 20 to 26 of FIG. 5 denote resistance variations $\delta Ry$ caused by changes in the rotation angle C. According to the above formula $v=(S_1-S_2)/(S_1+S_2)$ defining the value of v, the curves 20, 26 correspond to variations in $P_{11}$ and $P_{12}$ respectively. Namely, the curves 20, 26 show that $P_{11}(=P_{22})$ and $P_{12}(=P_{21})$ always have substantially equal absolute values of the opposite notations, regardless of whichever of two mutually perpendicular orientations is represented by the resistance of the resistor layer 12 or the resistor units 18, 19. The ordinate of FIG. 6 indicates resistance variations $\delta Rx$, $\delta Ry$ resulting from shearing stress. Assuming $W=1$, and $U=-1000$ kg/cm$^2$, the curves 27, 28 show that the resistances Rx, Ry vary with $P_{16}$, $P_{26}$ respectively. FIGS. 5 and 6 indicate that $P_{11}(=P_{22})$, $P_{12}(=P_{21})$ and $P_{16}$, $P_{26}$ always have substantially equal absolute values of the opposite notations, regardless of whichever of two mutually perpendicular orientations is represented by the resistance of the resistor units 18, 19.

This invention sets the ratio of resistances occurring in two mutually perpendicular orientations at 1:1. Assuming Rx=Ry, therefore, the previously described equation (1) may be replaced by the following equation (2):

$$\delta R = \frac{Rx}{R} [(P_{11} + P_{12})(S_1 + S_2) + (P_{16} + P_{26})S_6] \simeq 0 \quad (2)$$

As seen from the above equation (2), resistance variation is substantially reduced to zero.

Where the aforesaid crystal faces of a semiconductor substrate are used, not only a resistor layer extending in the direction described in connection with the 1st, 2nd and 5th groups of Table 1, but also resistor units extending in two mutually perpendicular directions display the same advantageous effect.

By way of comparison, there is described variation $\delta R$ in the total resistance of the resistor units 18, 19 in case of Rx≠Ry. From the foregoing equation (1), this resistance variation $\delta R$ may be expressed as follows:

$$\delta R = \frac{(P_{11} + P_{12})(S_1 + S_2)}{2} + \frac{(P_{11} - P_{12})(S_1 - S_2)}{2} \times \frac{Rx - Ry}{R} \quad (3)$$

Assuming $$\frac{(P_{11} + P_{12})(S_1 + S_2)}{2} = c \text{ and } \frac{(P_{11} - P_{12})(S_1 - S_2)}{2} = f$$

with respect to the above equation (3). Then c is substantially reduced to zero. Thus the resistance variation $\delta R$ is expressed as:

$$R = f \frac{Rx - Ry}{R} \quad (4)$$

Since the standard deviation of the term (Rx−Ry) can be regarded as substantially constant regardless of the orientation in which resistance occurs, the resistance variation $\delta R$ is defined by the extent to which f changes in accordance with said orientation. Namely, the resistance variation $\delta R$ becomes minimum in case of $f=<100>$, and maximum in case of $f=<011>$. Where, therefore, resistance arises in the orientation $<011>$ in case of Rx≠Ry, then it will be seen that resistance variation will prominently occur.

FIG. 7 is a similar curve diagram to FIG. 5, which was obtained by determining variations in the resistance of a p-conductivity type resistor layer formed in the same manner as in the foregoing embodiment on the main crystal face (511) of an n-conductivity type silicon semiconductor substrate 11. Theoretical calculation was made of those variations in the resistance of the resistor units 18, 19 mounted on the crystal face (511) of a silicon semiconductor substrate 11 which occurred when the directions in which said resistor units 18, 19 extended were displaced from the orientation $<01\bar{1}>$ toward the orientation $<\bar{2}55>$ through the rotation angle C.

FIG. 8 indicates the results of calculations made of variations $\delta R$ in the total resistance $R(=Rx+Ry)$ of the first and second resistor units 18, 19 in the same manner as in FIG. 7. The curve 40 represents the case of $v=1.0$; the curve 43 the case of $v=0$; and the curve 46 the case of $v=-1.0$. The curves 30, 36 given in FIG. 8 by way of comparison are the same as those shown in FIG. 7.

FIG. 9 shows those changes in a piezoelectric coefficient expressed by $P_{16}$ which correspond to the shift of a crystal orientation from $<01\bar{1}>$ to $<\bar{2}55>$. It will be seen from FIGS. 7, 8 and 9 that the piezoelectric coefficient of $P_{16}$ varies with the directions in which the first and second resistor units 18, 19 extend.

As mentioned above, where the first and second resistor units 18, 19 are arranged perpendicular to each other, namely are made to extend, for example, in the orientations $<01\bar{1}>$, $<\bar{2}55>$, and the ratio of their respective resistances is set at 1:1, then their total resistance will not prominently vary even when said resistor units 18, 19 are formed on the main surface (511) of a silicon substrate 11.

Where two p-conductivity type resistor units 18, 19 were formed in a mutually perpendicular direction on the main surface (811) or (911) of a n-conductivity type silicon substrate, a semiconductor element exhibits the same electric properties as observed in the case where the resistor units 18, 19 were mounted on the main surface (511) of the silicon substrate 11. Calculations were also made of resistance variations $\delta R_x$, $\delta R_y$ and changes in the coefficient of $P_{16}$ where the directions in which the two mutually perpendicular resistor units 18, 19 were displaced through an angle of 90° from the orientation $<01\bar{1}>$ toward the orientation $<\bar{1}44>$. The results of calculation are also shown in FIGS. 7, 8 and 9.

The foregoing description refers to the case where p-conductivity type resistor units 18, 19 were used. However, even n-conductivity type resistor units can display the same satisfactory effect a described above, if said resistor units are formed in a mutually perpendicular direction in the main surface {111} of a silicon substrate 11.

There will be described the n-conductivity type resistor units. In this case, a semiconductor device is prepared by diffusing a donor impurity in the main surface (111) of a silicon semiconductor substrate doped with an acceptor impurity, thereby forming first and second n-conductivity type resistor units in a mutually perpendicular direction. Measurements were made in the same manner as described above of the total resistance of said resistor units formed on the main surface (111) of the silicon substrate when the directions of said mutually perpendicular resistor units were displaced from the orientation $<01\bar{1}>$ to the orientation $<\bar{2}11>$, the results being presented in FIG. 10. In FIG. 10, straight lines 50 to 56 denote the cases where v had values of $-1.0(1.0)$, $-0.2(0.2)$, $-0.1(0.1)$, 0, 0.1($-0.1$), 0.2($-0.2$) and 1.0($-1.0$).

What is claimed is:

1. A semiconductor integrated circuit device comprising:
   a silicon semiconductor substrate of N-conductivity type having a least one main surface of a substantial (100), (511), (811), or (911) crystal face;
   a P-conductivity type resistor unit formed in said main surface, said resistor unit including (1) a first P-conductivity type resistor extending in a first direction in said main surface and having a first end and a second end, and (2) a second P-conductivity type resistor extending in a second direction in said main surface perpendicular to said first direction and having a first end solely connected to said second end of said first P-conductivity type resistor and a second end, said first and second P-conductivity type resistors having the same resistance; and
   a functional element formed in said main surface apart from said resistor unit and connected to said second end of said second P-conductivity type resistor.

2. The semiconductor device according to claim 1, wherein said first P-conductivity type resistor and said second P-conductivity type resistor are in contact for electrical connection.

3. The semiconductor device according to claim 1, wherein said first P-conductivity type resistor and said second P-conductivity type resistor are separately formed in said main surface of said N-conductivity type silicon substrate.

4. The semiconductor device according to claim 1, 2, or 3, further comprising a supporting plate on which said N-conductivity type silicon substrate is mounted, and a plastic resin molding in which said silicon substrate and said supporting plate are hermetically sealed.

5. The semiconductor device according to claim 4, wherein said first P-conductivity type resistor comprises a first plurality of separate resistor regions arranged in parallel, and said second P-conductivity type resistor comprises a second plurality of separate resistor regions arranged in parallel, said first plurality of separate resistor regions extending in a direction perpendicular to the direction of said second plurality of separate resistor regions.

6. A semiconductor integrated circuit device comprising:
   a silicon semiconductor substrate of P-conductivity type having at least one main surface of a substantial (111) crystal face;
   a N-conductivity type resistor unit formed in said main surface, said resistor unit including (1) a first N-conductivity type resistor extending in a first direction in said main surface and having a first end and a second end, and (2) a second N-conductivity type resistor extending in a second direction in said main surface perpendicular to said first direction and having a first end solely connected to said second end of said first N-conductivity type resistor and a second end, said first and second N-conductivity type resistors having the same resistance; and
   a functional element formed in said main surface apart from said resistor unit and connected to said second end of said second N-conductivity type resistor.

7. The semiconductor device according to claim 6, wherein said first N-conductivity type resistor and said second N-conductivity type resistor are in contact for electrical connection.

8. The semiconductor device according to claim 6, wherein said first N-conductivity type resistor and said second N-conductivity type resistor are separately formed in said main surface of said silicon substrate.

9. The semiconductor device according to claim 6, 7, or 8, further comprising a supporting plate on which said P-conductivity type silicon substrate is mounted, and a plastic resin molding in which said P-conductivity type silicon substrate and said supporting plate are hermetically sealed.

10. The semiconductor device according to claim 9, wherein said first N-conductivity type resistor comprises a first plurality of separate resistor regions arranged in parallel, and said second N-conductivity type resistor comprises a second plurality of separate resistor regions arranged in parallel, said first plurality of separate resistor regions extending in a direction perpendicular to the direction of said second plurality of separate resistor regions.

* * * * *